United States Patent [19]

Stasiak

[11] Patent Number: 5,348,909

[45] Date of Patent: Sep. 20, 1994

[54] MANUFACTURE OF PRINTHEAD WITH DIAMOND RESISTORS

[75] Inventor: James W. Stasiak, Longmont, Colo.

[73] Assignee: Lexmark International, Inc., Greenwich, Conn.

[21] Appl. No.: 38,205

[22] Filed: Mar. 26, 1993

[51] Int. Cl.$^5$ ............................................. H01L 21/70
[52] U.S. Cl. ...................................... 437/60; 437/918; 346/76 PH; 347/64
[58] Field of Search ............. 437/60, 918; 346/140 R, 346/76 PA; 219/543

[56] References Cited

U.S. PATENT DOCUMENTS 4,680,859  7/1987  Johnson ............................... 29/611
4,683,481  7/1987  Johnson ........................... 346/140 R

FOREIGN PATENT DOCUMENTS 59-213126A  12/1984  Japan .

OTHER PUBLICATIONS

"Electrical Conductivity of Nitrogen and Argon Implanted Diamond", Nuclear Instruments and Methods in Physics Research, pp. 1129–1133, 1983.

Wolf and Tauber, *Silicon Processing for the VLSI Era*, vol. I, pp. 321–324, 1990.

Journal of Applied Physics 54(4), Apr. 1993, at p. 2106, entitled "Effective p-type doping of diamond by boron ion implantation" by B. Braunstein and R. Kalish.

Japanese Journal of Applied Physics, vol. 28, No. 5, May 1989 at p. 758, entitled "Electrical Characteristics of Metal Contacts to Boron-Doped Diamond Epitaxial Film" by Hiromu Shimon et al.

*IBM Technical Disclosure Bulletin* article entitled "Thermal Ink Jet Heater Devices Incorporating Diamond—Like Carbon Films as Protective Overcoats," pp. 19–20, vol. 34, No. 2, Jul. 1991.

*Primary Examiner*—George Fourson
*Assistant Examiner*—Richard A. Booth
*Attorney, Agent, or Firm*—John A. Brady

[57] ABSTRACT

An thermal ink jet printhead is fabricated with resistors of doped diamond. A diamond substrate is masked in the pattern of the resistors and bombarded with boron ions with high energy to embed the boron with only a negligible amount on the surface. If a protective layer is applied, the same mask is used. The process is simple and low cost, and the resulting substrate is hard, insulating, and chemically inert.

4 Claims, No Drawings

MANUFACTURE OF PRINTHEAD WITH DIAMOND RESISTORS

TECHNICAL FIELD

Thermal ink jet printhead comprise an array of typically identical cavities, each having an internal resistor to heat the ink for expelling the ink from the cavity. Typically, these cavities are fabricated employing a number of laminations, each employing one or more steps. This invention is to such fabrication employing fewer steps, with corresponding savings in fabrication costs and potential defects.

BACKGROUND OF THE INVENTION

This invention employs resistors of doped diamond or with doping significantly below the surface by ion bombardment. Diamond and doped diamond is now established technically. Thus, Journal of Applied Physics 54(4), April 1983, at page 2106 in an article entitled "Effective p-type doping of diamond by boron ion implantation" by B. Braunstein and R. Kalish states as follows: Diamond-based semiconductor devices may turn out to be of significant importance thanks to the unique physical properties of diamond. Such devices have not been realized till now because of difficulties in doping. Standard doping techniques such as diffusion or introduction of impurities during crystal growth are hardly applicable to diamond so that the most promising way to dope diamond in a controlled way is by means of ion implantation. The successful use of this technique, however, requires finding annealing conditions which will drive the implants into electrically active sites and restore the diamond crystal structure, a task which is particularly complicated by the tendency of damaged diamond to turn into graphite.

The Japanese Journal of Applied Physics, Vol. 28, No. 5, May 1989, at page 758 in an article entitled "Electrical Characteristics of Metal Contacts to Boron-Doped Diamond Epitaxial Film" by Hiromu Shimon et al states as follows: Semiconducting diamond is expected to be an attractive material for high-frequency and high-power devices, due to its wide band gap (5.5 eV), high breakdown voltage (10E6-1IE7 V.cmE-1),(E1,2) high electron and hole mobilities (2000 cmE2VE-1sE-1 and 1800 cmE2VE-1sE-1, respectively, E(3) and high electron saturation velocity (2×10E7 cm.sE-1).(E4) In addition, diamond also has the highest thermal conductivity (20W.cmE-1KE-1)(E5) of any solid at room temperature, higher by a factor of 5 than that in Cu. These properties indicate that high-power, high-frequency diamond devices may surpass the performance of devices fabricated in conventional semiconductors.

Diamond film as a protective layer over the thin film resistors of a thermal printhead is disclosed in the *IBM Technical Disclosure Bulletin* article entitled "Thermal Ink Jet Heater Devices Incorporating Diamond-Like Carbon Films as Protective Overcoats," pp. 19-20, Vol. 34, No. 2, July 1991. The diamond layer is disclosed as being deposited in situ by various methods, including vapor deposition.

DISCLOSURE OF THE INVENTION

This invention recognizes that doping sufficiently deep so that the surface has no dopant provides in itself a very stable resistor. Accordingly, such doping is accomplished by ion deposition through a mask to define the resistor in each cavity of an ink jet thermal printhead. The mask may be left in place while a further protective layer is applied, but no separate masking to apply a protective layer is required. The printhead comprises a substrate, typically a silicon wafer on which diamond is deposited by any conventional technique. A resist mask is then applied to the diamond having openings defining the resistors for each of the multiple cavities of a thermal printhead. Boron ions are then applied at high energy in a vacuum through the mask, by which boron is embedded in the diamond with only a negligible amount on the surface.

Such a configuration is largely stable and might be used without a protective layer. Any protective layer is applied using the existing resist mask, as covering overlapping the edges is unnecessary. The process is relatively simple and low cost. The resulting substrate is hard, insulating and chemically inert.

BEST MODE FOR CARRYING OUT THE INVENTION

1. Diamond Substrate

Polished parallel plates of natural type 1a or type 11 a high resistivity diamond wafers are used as the starting substrates. The wafer is cleaned and prepared for photolithography using standard cleaning and drying procedures. A positive organic resist such as DQN (Diazquinone) or PMMA (Polymethyl Methacrylate) is used. A primer or adhesion promoter may be required to improve the adhesion of the resist to the substrate. The primer and resist is spun on using standard photoresist spinning equipment and procedures. Resist thicknesses of about 1 um (micron) have been shown to be sufficiently thick to mask all dopant ions. (Since resists tend to harden during the ion implantation, the resist profile should be overcut so that the bottom half of the stencil is shadowed and allows for liquid resist stripping.)

After the resist has been applied, a photomask is used to expose the resist. Exposure energies, times and wavelengths must be chosen specifically for the resist system which is used and for the resist thickness. The photomask contains the pattern for the doped resistor regions. After exposure, the resist is developed and hardened for the ion implantation step. With the resist mask in place, the patterned diamond wafer is then implanted. In this application, p-type doping using boron ions is employed. The implant energy will determine the ion implantation profile and will also determine how much damage occurs at the substrate surface. Significant graphitization of the diamond can occur at high dosages. Implant energies and dosages are initially determined experimentally and depend on the target resistance of the buried structures.

The implant profile must be selected such that the "mean" of the dopant distribution falls below the surface. This will insure that the surface resistance remains high above the doped region which guarantees that the resistors remain isolated when ink is present. This is a crucial consideration for ink jet device applications.

After implantation, the resist stencil must be stripped and the wafer cleaned of residual organics. A light $O_2$ plasma clean may be used.

The next step is to anneal the wafer to remove the damage created by the ion bombardment and to "heal" the surface above the doped region. Anneal temperatures and times are determined initially through experimentation and careful surface analysis and measurements. In some cases, a chemical etch may be required to remove the surface graphite layer for heavily implanted resistors.

To make conductive contacts, a second photomask is applied which defines the thin film wiring of the printhead. After metal lines (e.g. aluminum, tungsten, titanium, tantalum) are deposited and patterned, contact to the buried doped resistor is accomplished by an anneal at temperatures and for times determined by the choice of contact metal. This anneal step is crucial for insuring ohmic contact to the buried layer and for repair of the surface of the host diamond, material which has been damaged by ion bombardment. Depending on the contact metallurgy, and the method for depositing the metal (e.g. evaporation or sputtering), a lift-off or subtractive etch process for the mask is selected. Following standard deposition and patterning procedures, the metal contacts are then defined. Typically, titanium and tungsten contacts have been shown to provide good ohmic or Schotchy properties with boron doped diamond material. The following anneal improves the contact (reduce the contact resistance) to the buried resistors. The specific anneal details (temperature, atmosphere and duration) are determined experimentally by monitoring the contact resistance and current-voltage characteristics. At this point, the basic process is complete. It is efficient and relatively low in cost.

2. Silicon Substrate/Deposited Diamond Film/Ion Implantation Approach

In this approach, the recipe given above would be applied to thick deposited diamond films on silicon substrates. There are many well established methods for depositing diamond thin films including hot filament methods for depositing high quality diamond films and thermal CVD methods. Both approaches have been used successfully to provide high quality diamond material for boron doping. After the diamond films have been deposited on the silicon substrate, the film would be masked, patterned and implanted as discussed in the foregoing. The specifics regarding the implant energy and dosage are initially determined experimentally. These details will take into account the deposited film thickness and morphology. The metal contact patterning and anneal conditions are the same as discussed above. The use of silicon wafers offers a significant advantage regarding cost and processing convenience and extends naturally into existing ink jet processing procedures.

In summary as both of the foregoing fabrications: the resulting doped substrates are remarkably hard, insulating and chemically inert, making them ideal for use in severe corrosive environments. The process required to fabricate these devices significantly reduces the number of lithographic and deposition stops and consequently leads to significant cost reductions in fabrication. Furthermore, by introducing the doping procedure, the integration of active devices such as transistors and diodes which can serve as multiplexing circuits and logic can be more readily accommodated.

I claim:

1. The method of fabrication of a thermal printhead comprising applying a resist mask on a substrate, said substrate having locations for forming multiple cavities of said thermal printhead and having an outer layer of diamond, said mask having openings at said locations for forming said cavities to form resistors for expelling ink from said printhead, and bombarding said masked substrate with ions to dope at the areas defined by the openings of said mask to form said resistors, said doping being substantially all in said outer layer of diamond.

2. The method as in claim 1 also comprising fabricating protective layers by using said mask to define the locations at which said protective layers are fabricated.

3. The method as in claim 1 in which said substrate is silicon on which diamond is deposited to form said outer layer.

4. The method as in claim 1 in which said substrate is silicon on which diamond is deposited to form said outer layer.

* * * * *